United States Patent
Wang et al.

(10) Patent No.: US 9,156,732 B2
(45) Date of Patent: Oct. 13, 2015

(54) METHOD FOR STRENGTHENING HOUSING AND HOUSING MADE BY SAME

(75) Inventors: Ren-Bo Wang, Shenzhen (CN); Xin-Wu Guan, Shenzhen (CN); Po-Feng Ho, New Taipei (TW)

(73) Assignees: SHENZHEN FUTAIHONG PRECISION INDUSTRY CO., LTD., Shenzhen (CN); FIH (Hong Kong) Limited, Kowloon (HK)

( * ) Notice: Subject to any disclaimer, the term of this patent is extended or adjusted under 35 U.S.C. 154(b) by 778 days.

(21) Appl. No.: 13/451,808

(22) Filed: Apr. 20, 2012

(65) Prior Publication Data
US 2013/0119058 A1    May 16, 2013

(51) Int. Cl.
*C03C 21/00* (2006.01)
*H05K 5/00* (2006.01)

(52) U.S. Cl.
CPC *C03C 21/00* (2013.01); *H05K 5/00* (2013.01); *Y10T 428/13* (2015.01); *Y10T 428/131* (2015.01); *Y10T 428/1314* (2015.01); *Y10T 428/1317* (2015.01)

(58) Field of Classification Search
CPC ........ C03C 21/00; H05K 5/00; Y10T 428/13; Y10T 428/131; Y10T 428/1314; Y10T 428/1317
See application file for complete search history.

(56) References Cited

U.S. PATENT DOCUMENTS 3,415,637 A * 12/1968 Glynn .......................... 65/30.14

\* cited by examiner

*Primary Examiner* — Michael C Miggins
(74) *Attorney, Agent, or Firm* — Novak Druce Connolly Bove + Quigg LLP

(57) ABSTRACT

A method for strengthening a housing comprises the following steps: providing a housing being made of colored glaze and having an initial temperature of about 480° C. to about 550° C.; and spraying the surface of the housing using a spray solution containing potassium nitrate, potassium silicate, diatomite, and water to create an exterior layer on the surface. The exterior layer contains $K^+$ ions, and the concentration of the $K^+$ ions gradually decreases from a maximum value in the area of the outside surface of the exterior layer to zero in the area of the inside of the housing.

7 Claims, 1 Drawing Sheet

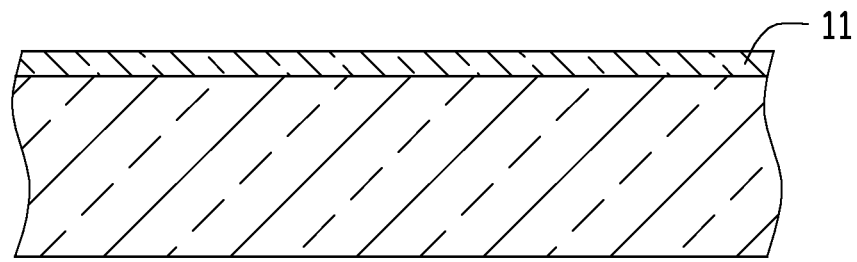

METHOD FOR STRENGTHENING HOUSING AND HOUSING MADE BY SAME

BACKGROUND

1. Technical Field

The present disclosure relates to a method for strengthening housings and housings made by the method.

2. Description of Related Art

Many housings of portable electronic devices are made of metal or plastic, which cannot present a novel and attractive appearance.

Colored glaze is a kind of glass containing lead dioxide, and is aesthetically appealing. However, the colored glaze is brittle and can break easily. Accordingly, a housing made of colored glaze usually has a poor strength.

Therefore, there is room for improvement within the art.

BRIEF DESCRIPTION OF THE FIGURE

Many aspects of the housing can be better understood with reference to the following drawing. The components in the drawing are not necessarily drawn to scale, the emphasis instead being placed upon clearly illustrating the principles of the housing. Moreover, in the drawing like reference numerals designate corresponding parts throughout the drawing.

The FIG. is a cross-sectional view of an exemplary embodiment of a housing.

DETAILED DESCRIPTION

The FIG. shows a housing 10 according to an exemplary embodiment. A strengthening method for the housing 10 may include the following steps:

The housing 10 made of colored glaze is formed.

The housing 10 may be manufactured by an injection molding process. Colored glaze blocks are used as material and are melted at an environmental temperature of about 600° C. to 800° C. Then the molten colored glaze is injected into a mold (not shown) and solidifies to form the housing 10 having a desired shape.

The housing 10 is strengthened by salt spraying.

The housing 10 having a temperature of about 480° C. to about 550° C. is put into a spray exhaust device (not shown). A cold spray solution is sprayed on the surface of the housing 10 until the temperature of the housing 10 drops to room temperature. The spray solution contains potassium nitrate, potassium silicate, diatomite, and water. The mass percentage of the potassium nitrate in the spray solution is about 37.5% to about 42.5%, the mass percentage of the potassium silicate is about 7.5% to about 10%, the mass percentage of the diatomite is about 2.5%, the remaining is water.

During the spraying process, sodium ions ($Na^+$) contained in the housing 10 exchange with potassium ions ($K^+$) of the spray solution due to ion diffusion. As potassium (K+) ions are larger (bulkier) than sodium (Na+) ions, bulky $K^+$ ions enter into the glass network of the housing 10 and occupy the space that the $Na^+$ ions originally occupied. When the housing 10 is gradually cooled, the glass network of the housing 10 shrinks. Since the bulky $K^+$ ions occupy more space in the glass network than $Na^+$ ions, an extrusion stress is resulted on the surface of the housing 10. The extrusion stress remains in the cooled housing 10, which creates an exterior layer 11 on the housing 10 having a higher density than the density of the interior of the housing 10. The exterior layer 11 prevents the housing 10 from forming micro-cracks on the surface, and greatly enhances the bending resistance strength and the shock resistance strength of the housing 10.

The exterior layer 11 has a thickness of about 5 μm to about 20 μm. The concentration of the $K^+$ ions gradually decreases from a maximum value in the area of the outside surface of the exterior layer 11 to zero in the area of the inside of the housing 10.

Additionally, during the spraying process, water contained in the spray solution is atomized to quickly remove the heat from the housing 10, which improves the tensile strength of the housing 10 in a similar principle to cold quenching glass.

An exterior layer 11 is formed on the surface of the housing 10 to strengthen the housing 20. The exterior layer 11 contains $K^+$ ions. The concentration of the $K^+$ ions gradually decreases from a maximum value in the area of the outside surface of the exterior layer 11 to zero in the area of the inside of the housing 10. The exterior layer 11 provides the housing 10 a good chemical durability, an acid and alkali resistance, a high hardness, and a high wear resistance. Furthermore, the housing 10 made of colored glaze presents a crystal-like appearance and a vibrant color.

The housing 10 may be a shell of an electronic device, such as mobile phone.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A method for strengthening a housing, comprising:
    forming a housing being made of colored glaze and having an initial temperature of about 480° C. to about 550° C.; and
    spraying the housing surface using a spray solution containing potassium nitrate, potassium silicate, diatomite, and water to create an exterior layer on the outer housing surface, the exterior layer containing potassium ions, whereby the concentration of the potassium ions gradually decreases from a maximum value in the area of the outside surface of the exterior layer to zero in the area of the inside of the housing.

2. The method as claimed in claim 1, wherein mass percentage of the potassium nitrate in the spray solution is about 37.5% to about 42.5%.

3. The method as claimed in claim 1, wherein mass percentage of the potassium silicate in the spray solution is about 7.5% to about 10%.

4. The method as claimed in claim 1, wherein mass percentage of the diatomite in the spray solution is about 2.5%.

5. The method as claimed in claim 1, further comprising forming the housing by injection molding.

6. The method as claimed in claim 5, forming the housing further comprises:
    heating and melting colored glaze blocks at a temperature of about 600° C. to about 800° C.;
    injection molding the molten colored glaze into a mold; and
    solidifying the molten colored glaze to form a housing having a desired shape.

7. The method as claimed in claim 5, wherein the exterior layer has a thickness of about 5 μm to about 20 μm.

* * * * *